United States Patent

Ienaga

[11] Patent Number: 6,118,714
[45] Date of Patent: Sep. 12, 2000

[54] SEMICONDUCTOR MEMORY CIRCUIT WITH BIT LINES DISCHARGING MEANS

[75] Inventor: Takashi Ienaga, Kanagawa, Japan

[73] Assignee: NEC Corporation, Tokyo, Japan

[21] Appl. No.: 09/314,080

[22] Filed: May 19, 1999

[30] Foreign Application Priority Data

May 25, 1998 [JP] Japan ................................ 10-142801

[51] Int. Cl.[7] .................................................. G11C 7/00
[52] U.S. Cl. ...................................... 365/204; 365/230.03
[58] Field of Search .............................. 365/204, 230.03, 365/203, 207, 196

[56] References Cited

U.S. PATENT DOCUMENTS

| | | |
|---|---|---|
| 4,634,890 | 1/1987 | Lee . |
| 4,692,902 | 9/1987 | Tanaka et al. . |
| 5,479,374 | 12/1995 | Kobayashi et al. .................. 365/233.5 |
| 5,703,820 | 12/1997 | Kohno ..................................... 365/204 |

FOREIGN PATENT DOCUMENTS

| | | | |
|---|---|---|---|
| 57-117178 | 7/1982 | Japan .............................. G11C 11/34 |
| 59-51075 | 12/1984 | Japan .............................. G11C 11/41 |
| 06103779 | 4/1994 | Japan . |
| 9-231766 | 9/1997 | Japan .............................. G11C 11/34 |
| 9-330596 | 12/1997 | Japan .............................. G11C 14/00 |
| 10-106266 | 4/1998 | Japan .............................. G11C 11/41 |

*Primary Examiner*—David Nelms
*Assistant Examiner*—David Lam
*Attorney, Agent, or Firm*—Sughrue, Mion, Zinn, Macpeak & Seas, PLLC

[57] ABSTRACT

A semiconductor memory circuit reduces a current consumed by sense amplifiers, prevents erroneous operation, and can operate at high speed. The semiconductor memory circuit has a plurality of memory blocks each comprising a decoder, a plurality of memory cells, a plurality of sense amplifiers for amplifying potential changes in bit lines, a data latch for latching outputs from the sense amplifiers, a plurality of nMOS transistors for discharging the bit lines, an NAND gate for generating a sense amplifier de-energizing signal RD, and a reference voltage generator. In response to a memory block selecting signal CS, the NAND gate generates the sense amplifier de-energizing signal RD, which is applied to energize the nMOS transistors to discharge the bit lines of a memory block which is not selected.

10 Claims, 8 Drawing Sheets

SEMICONDUCTOR MEMORY CIRCUIT WITH BIT LINES DISCHARGING MEANS

BACKGROUND OF THE INVENTION

1. Field of the Invention

The present invention relates to a semiconductor memory circuit, and more particularly to a semiconductor memory circuit in which current consumed by sense amplifiers is reduced, erroneous operation is prevented, and which can operate at high speed.

2. Description of the Related Art

In recent years, the storage capacity of semiconductor memory circuits (hereinafter also referred to as "memory") for use in microcomputers is increasing yearly.

An increase in the storage capacity of memories in high-speed microcomputers results in an increase in the load capacity on word lines and bit lines, leading to a reduction in the speed of operation. Therefore, it has been necessary to divide a memory into memory blocks for maintaining a desired speed of operation.

One conventional high-speed semiconductor memory circuit is shown in FIG. 1 of the accompanying drawings, and each of the memory blocks of the semiconductor memory circuit shown in FIG. 1 is shown in FIG. 2. FIG. 3 shows each of the sense amplifiers used in the memory blocks.

As shown in FIGS. 1 through 3, the conventional high-speed semiconductor memory circuit used in high-speed microcomputers comprises memory blocks 601, 602, tristate buffers 603, 604 for selecting outputs of the memory blocks 601, 602 with a most significant bit of address 611, and an inverter 605 for controlling the tristate buffer 604.

Each of the memory blocks 601, 602 comprises a decoder 712 for decoding an address 720 to select a word line 721, a plurality of memory cells 711 for making a corresponding bit line 722 active in response to the selection of the word line 721, an array of sense amplifiers 710 for amplifying signal changes in bit lines 722, a data latch 709 for latching output signals from the sense amplifiers 710 for the period in which a precharging signal PRI is PRI=0, a reference voltage generator 708 for generating a reference voltage RREF to be applied to the sense amplifiers 710, and an inverter 706.

Each of the sense amplifiers 710 comprises a plurality of nMOS transistors 807–811, a plurality of pMOS transistors 802–806, a NOR gate 801, and a pair of inverters 812, 813. In FIGS. 2 and 3, PRI represents a precharging signal, RD a sense amplifier de-energizing signal, S bit lines, RREF a reference signal, SOUT output signals from the sense amplifiers, and OUT an output signal from the memory block.

In the conventional memory, the two memory blocks 601, 602 shown in FIG. 1 are always operated, and one of the data outputs OUT0, OUT1 thereof is selected by the most significant bit of address 611. However, since the memory blocks are always in operation irrespective of whether they are selected or not, the conventional memory has suffered a problem in that the power consumption thereof increases as the number of memory blocks used increases. The memory blocks need to be in operation at all times in order to allow the memory to operate at high speed.

The power consumption of the memory may be reduced by de-energizing those memory blocks which are not selected by the most significant bit of address 611. If those memory blocks are de-energized, then the memory cannot operate at high speed. The reasons for the high-speed operation failure will be described below.

Prior to describing the overall operation of the memory, operation of each of the sense amplifiers 710 will be described below with reference to FIG. 4. In order to operate the sense amplifier 710, a predetermined reference voltage RREF generated by the reference voltage generator 708 is applied to the sense amplifier 710. Operation at the time the sense amplifier de-energizing signal RD is RD=0 will be described below.

During a precharging period 901, since the precharging signal PRI is PRI=1, the NOR gate 801 produces an output "0". The pMOS transistor 805 is turned on, increasing the potential of a line 814. At this time, if the bit line S is low in level, then the pMOS transistor 803 is turned on, turning on the nMOS transistor 809. Charges on the line 814 flow to charge the bit line S. When the voltage of the bit line S rises to a certain level, the nMOS transistor 808 starts being turned on, and the pMOS transistor 803 starts being turned off. Therefore, before the voltage of the bit line S reaches a power supply voltage, the nMOS transistor 809 is turned off, ending the precharging of the bit line S. Thus, the bit line S is precharged to a potential lower than the power supply voltage, which is determined by the ratio of the pMOS and nMOS transistors 803, 808 (see a precharged-voltage curve region indicated by 905 in FIG. 4).

The pMOS transistor 806 is turned off because the pMOS transistor 805 is turned on. Because the nMOS transistor 811 is turned on by the reference voltage RREF and the nMOS transistor 810 is turned on at all times, an input "0" is supplied to the inverter 812, so that the sense amplifier produces an output signal SOUT "0". During this period, an address is determined, and the decoder 712 selects one word line 721. The sense amplifier operates in the same manner during a precharging period 903.

Sampling periods 902, 904 will be described below. Since the precharging signal PRI is PRI=0 in these sampling periods 902, 904, the NOR gate 801 produces an output "1". Therefore, the pMOS transistor 805 is turned off. It is assumed that when a word line is selected as a result of the decoding of an address, the potential of a bit line drops in the period 902 and remains unchanged in the period 904.

In the period 902, the potential of the bit line drops. The pMOS transistor 803 starts being turned on, and the nMOS transistor 808 starts being turned off. Therefore, the nMOS transistor 809 starts being turned on, lowering the potential of the line 814. The pMOS transistor 806 then starts being turned on, and the potential of the input to the inverter 812 starts increasing, causing the sense amplifier to produce an output signal SOUT "1". Since the bit line has been precharged to a voltage lower than the power supply voltage, the bit line can be discharged at high speed, so that the sense amplifier can operate at high speed. In the period 904, inasmuch as the potential of the bit line remains unchanged, the potentials in various parts of the sense amplifier also remain unchanged. Thus, the sense amplifier produces the same output signal as the output signal produced in the period 903.

When the sense amplifier de-energizing signal RD is RD=1, the nMOS transistor 807 is turned on, the pMOS transistor 802 is turned off, and the NOR gate 801 produces an output "0". Consequently, the nMOS transistor 809 is turned off, and the pMOS transistor 805 is turned on. Irrespective of the precharging signal PRI, the line 814 is precharged, and the bit line S is disconnected by the nMOS transistor 809. Therefore, the sense amplifier always produces an output signal SOUT "0" because the nMOS transistor 811 is turned on by the reference voltage RREF and the nMOS transistor 810 is turned on at all times. This holds true in any period. As can be understood from the description so far, the sense amplifier is energized when the sense amplifier de-energizing signal RD is RD=0, and de-energized when the sense amplifier de-energizing signal RD is RD=1, disconnecting the bit line, with the result that the sense amplifier always produces an output signal SOUT "0".

For de-energizing the sense amplifier with the most significant bit of address in a conventional arrangement, a semiconductor memory circuit may be arranged as shown in FIG. 5 of the accompanying drawings, and a memory block may be arranged as shown in FIG. 6 of the accompanying drawings. Operation of this semiconductor memory circuit will be described below with reference to FIGS. 5, 6 and 7. FIG. 7 is a timing chart of an operation sequence for de-energizing the sense amplifier with the most significant bit of address. In FIG. 7, the solid-line curves represent waveforms of erroneous operation, and the dotted-line curves represent waveforms of ideal operation.

The memory block shown in FIG. 6 differs from the memory block shown in FIG. 2 in that a memory block selecting signal CS is applied via a NAND gate 1107, rather than the inverter 706, to produce a sense amplifier de-energizing signal RD for sense amplifiers 1110.

Since the switching of a reference voltage generator 1108 is time-consuming, a reference voltage ON signal REFON is turned on at all times.

Periods 1201–1204 in which the most significant bit of address is "0" in FIG. 7 will first be described below. The period 1201 is a precharged period, and the memory block selecting signal CS for a memory block 1002 is "1", selecting the memory block 1002. The NAND gate 1107 produces an output "0", and the sense amplifier de-energizing signal RD is "0". At this time, the sense amplifiers 1110 are precharged, and bit lines 1122 are precharged to a predetermined voltage lower than the power supply voltage.

On the other hand, the memory block selecting signal CS for a memory block 1001 is "0", not selecting the memory block 1001. Therefore, the NAND gate 1107 produces an output "1", and the sense amplifier de-energizing signal RD becomes "1", de-energizing the sense amplifiers 1110. At this time, the bit lines 1122 are disconnected from the sense amplifiers 1110. The bit lines 1122 thus disconnected may possibly be charged up due to other signals coupled thereto and extraneous noise.

In the period 1202, since the memory block selecting signal CS for the memory block 1002 is "1", the sense amplifiers 1110 are in a sampling state, and the bit lines 1122 are discharged. The sense amplifiers produce output signals SOUT "1", and the memory block produces an output OUT "1" immediately before the end of the period 1202. The memory block selecting signal CS for the memory block 1001 is "0", and the sense amplifiers 1110 thereof keep de-energized. At this time, as in the period 1201, the bit lines 1122 may possibly be charged up.

In the period 1203, the sense amplifiers 1110 are precharged as in the period 1201, and the output OUT0 of the memory block 1002 latches the sense amplifier outputs OUT in the period 1202 and produces "1". The memory block 1001 produces an output OUT1 "0".

In the period 1204, the sense amplifiers 1110 operate in substantially the same manner as in the period 1202. However, since the bit lines 1122 remain unchanged, the memory block produces an output OUT "0".

Periods 1205–1208 in which the most significant bit of address is "1" in FIG. 7 will be described below. The period 1205 is a precharged period. The sense amplifier de-energizing signal RD for the memory block 1002 is RD=0, so that the sense amplifiers 1110 are precharged, disconnecting the bit lines 1122. At this time, as shown in FIG. 7, the bit lines 1122 may possibly be charged up. In the memory block 1001, the bit lines 1122 tend to be precharged, but will not be precharged furthermore because they have already been at a potential greater than the preset voltage.

In the period 1206, the memory block 1002 remains in the same state as in the period 1205. In the memory block 1001, the potential of the bit lines 1122 starts being lowered. However, since the bit lines 1122 have been charged up to a potential higher than the preset potential due to other signals coupled thereto and extraneous noise, it takes more time to discharge the bit lines 1122 than it would have if they were not charged. Thus, the sense amplifier output signal SOUT changes with a delay, allowing erroneous data "0" to be latched by a data latch 1109.

In the periods 1207, 1208, the sense amplifiers 1110 operate normally because the bit lines 1122 have been discharged. However, in periods 1209, 1210 immediately after the selection of a memory block has been changed, the sense amplifiers 1110 suffer the same erroneous operation as described above.

As described above, the conventional memory with the above arrangement for de-energizing the sense amplifier with the most significant bit of address has been disadvantageous in that the operation of the memory is slowed down upon switching between the memory blocks, tending to result in an erroneous operation. Therefore, it has not been possible to use the conventional memory as it is.

Japanese laid-open patent publication No. 117178/82 discloses a memory circuit divided into memory blocks associated with respective differential amplifiers, which are selectively activated to read data at a relatively high speed without being subject to noise. Japanese laid-open patent publication No. 106266/98 reveals a semiconductor memory device having bit lines which are not associated with a selector switch, but associated with respective sense amplifiers which are selectively enabled to select a bit line, so that the number of transistors is reduced, the area of the layout is reduced, and the operating speed is increased. Each of the bit lines described in these publications comprises two complementary bit lines. Memory circuits other than RAMs, e.g., ROMs and FLASH EEPROMs use single bit lines for reducing the area of the layout. Even if the bit lines disclosed in the above publications include single bit lines, the publications fail to show any means for solving the problem that the operation of the memory is slowed down upon switching between the memory blocks, tending to result in an erroneous operation.

SUMMARY OF THE INVENTION

It is an object of the present invention to provide a semiconductor memory circuit in which current consumed by sense amplifiers is reduced, erroneous operation is prevented, and which can operate at high speed.

According to an aspect of the present invention, there is provided a semiconductor memory circuit comprising a plurality of memory blocks and selecting means for alternatively selecting the memory blocks, each of the memory blocks comprising a plurality of memory cells for storing data, the memory cells being disposed at intersections of a plurality of word lines and a plurality of bit lines, a plurality of sense amplifiers for amplifying potential changes in the bit lines, sense amplifier control means for controlling an active state of the sense amplifiers depending on an output of the selecting means, and discharging means for discharging the bit lines which are connected to the sense amplifiers which are inactivated by the sense amplifier control means.

Each of the memory blocks may have a data latch for latching outputs of the sense amplifiers during a predetermined period.

The sense amplifier control means may comprise a logic circuit for outputting a sense amplifier de-energizing signal to the sense amplifiers when the memory block having the sense amplifiers is not selected. The discharging means comprises a plurality of MOS transistors connected respectively to the bit lines for grounding the bit lines when one of the memory blocks is not selected.

According to another aspect of the present invention, there is provided a semiconductor memory circuit comprising a plurality of memory blocks and selecting means for alternatively selecting the memory blocks, each of the memory blocks comprising a plurality of memory cells for storing data, the memory cells being disposed at intersections of a plurality of word lines and a plurality of bit lines, a sense amplifier for amplifying a potential change in a bit line connected thereto, a selector for selecting and connecting one of the bit lines to the sense amplifier, sense amplifier control means for controlling an active state of the sense amplifiers depending on an output of the selecting means, and discharging means for discharging the bit lines, the discharging means comprising means for discharging the bit line connected to the sense amplifier inactivated by the sense amplifier control means and the bit line connected to the selector, and discharging the bit lines which are not selected which are connected to the selector if the sense amplifier is active.

The sense amplifier control means may comprise a logic circuit for outputting a sense amplifier de-energizing signal to the sense amplifier when one of the memory blocks is not selected, and wherein the discharging means comprises a plurality of MOS transistors connected respectively to the bit lines connected to the memory cells and the bit line connected the sense amplifier, for grounding the bit lines if the bit lines are not selected With the above arrangement of the present invention, a semiconductor memory circuit for use in high-speed microcomputers has a plurality of memory blocks and a circuit for preventing sense amplifiers of the memory blocks from operation which does not require to be accessed and setting bit lines connected to those sense amplifiers to a low level.

A memory block selecting signal is applied to alternatively select one of the memory blocks, and those memory blocks which are not selected de-energize the sense amplifiers thereof. At this time, the bit lines of the memory blocks in which the sense amplifiers are de-energized are discharged and maintained at a low level.

Since the sense amplifiers in the memory blocks which are not selected are de-energized, as much power consumption is reduced. Because the bit lines are fixed to the low level while the sense amplifiers are de-energized, no erroneous operation takes place when the sense amplifiers start operating again.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 8:
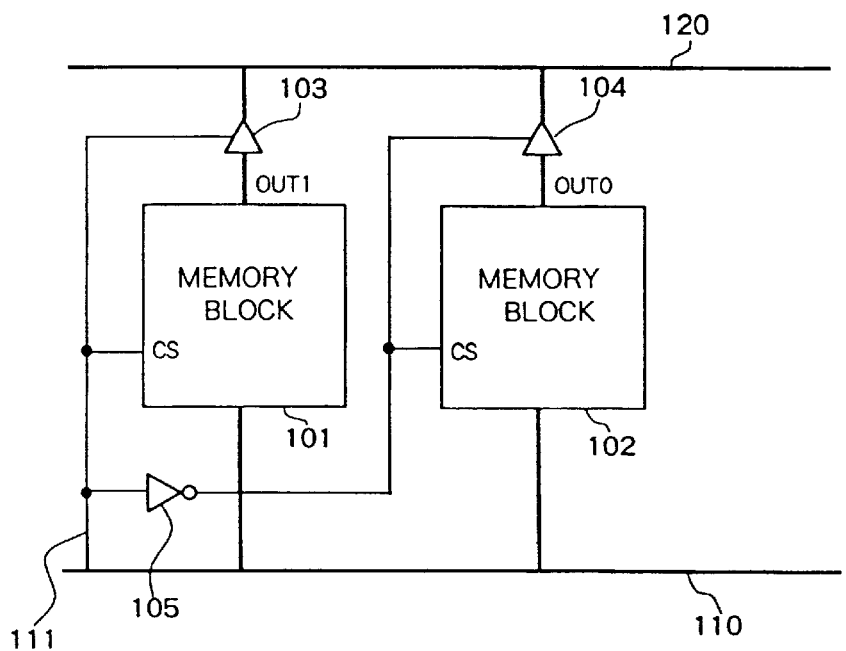
FIG. 8 is a block diagram of a semiconductor memory circuit according to a first embodiment of the present invention.

As shown in FIG. 8, a semiconductor memory circuit according to a first embodiment of the present invention comprises memory blocks 101, 102 for outputting data onto output bus 120 in response to addresses, from address input bus 110 tristate buffers 103, 104 for selecting outputs of the memory blocks 101, 102 with a most significant bit of address 111, and an inverter 105 for controlling the tristate buffer 104.

Figure 9:
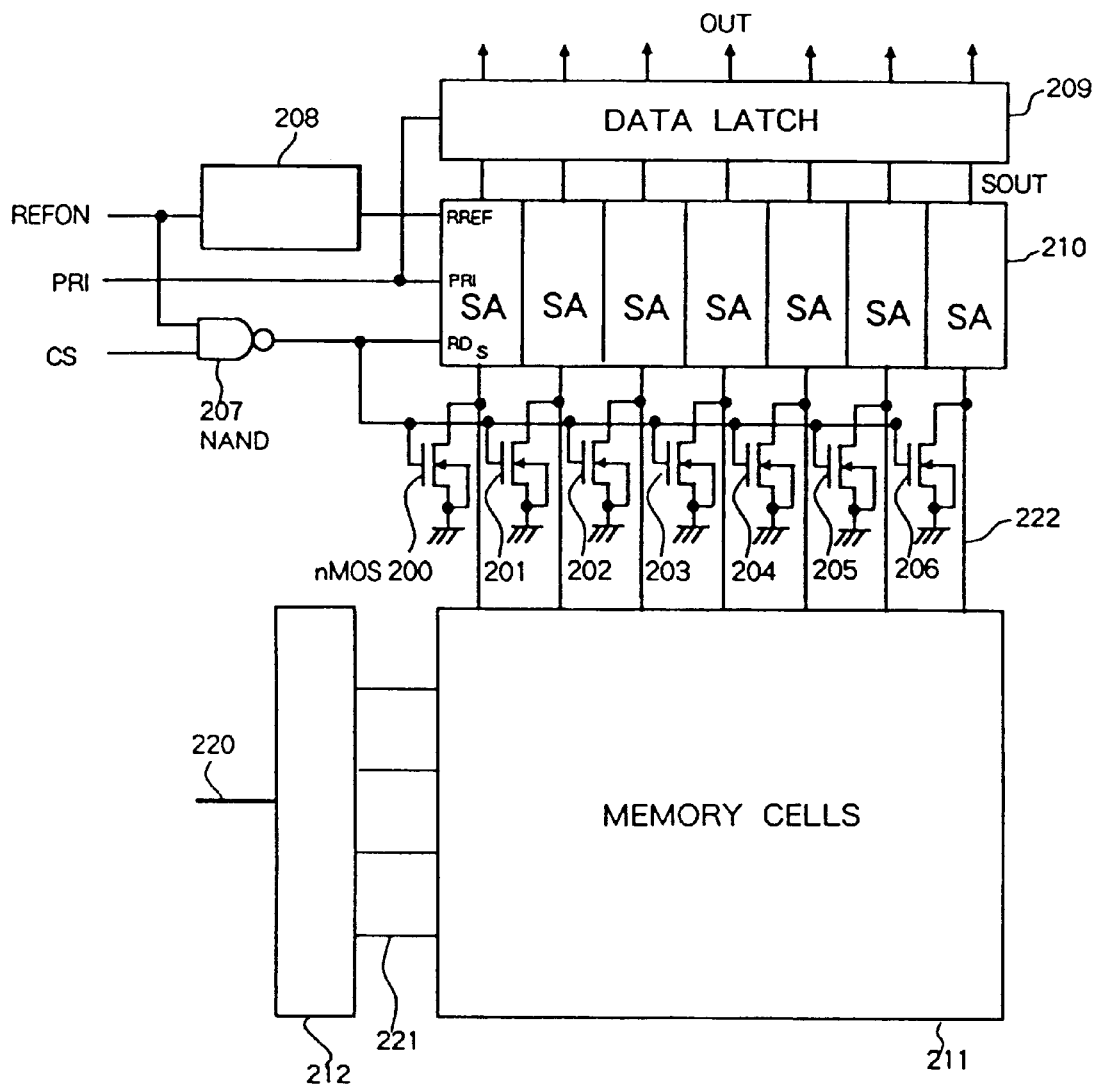
FIG. 9 is a block diagram of a memory block in the semiconductor memory circuit shown in FIG. 8.

As shown in FIG. 9, each of the memory blocks 101, 102 comprises a decoder 212, a plurality of memory cells 211, a plurality of sense amplifiers 210, a data latch 209, a plurality of nMOS transistors 200 through 206, a NAND gate 207, and a reference voltage generator 208.

The decoder 212 decodes an address 220 to select a word line 221. The memory cells 211, which store data, respond to the selected word line 221 to make a corresponding bit line 222 active. The sense amplifiers 210 amplify changes in the potentials of corresponding bit lines 222. The data latch 209 latches outputs of the sense amplifiers 210 during a period in which a precharging signal PRI is PRI=0. The nMOS transistors 200 through 206 discharge the respective bit lines 222. The NAND gate 207 generates a sense amplifier de-energizing signal RD. The reference voltage generator 208 supplies a reference voltage RREF to the sense amplifiers 210. The precharging signal PRI is also used as a clock signal for the data latch 209. A reference voltage ON signal REFON is supplied to the reference voltage generator 208 and the NAND gate 207. A memory block selecting signal CS is supplied to the NAND gate 207.

Each of the memory blocks 101, 102 is characterized in that the sense amplifier de-energizing signal RD is generated from the reference voltage ON signal REFON and the memory block selecting signal CS and that the nMOS transistors 200 through 206 discharge the corresponding bit lines 222 in response to the sense amplifier de-energizing signal RD.

Figure 1:
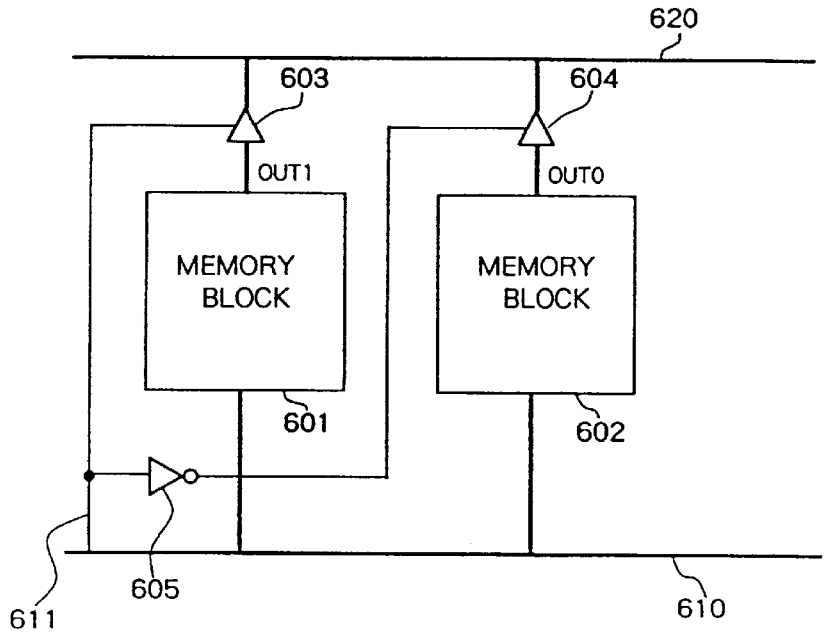
FIG. 1 is a block diagram of a conventional semiconductor memory circuit.
Figure 2:
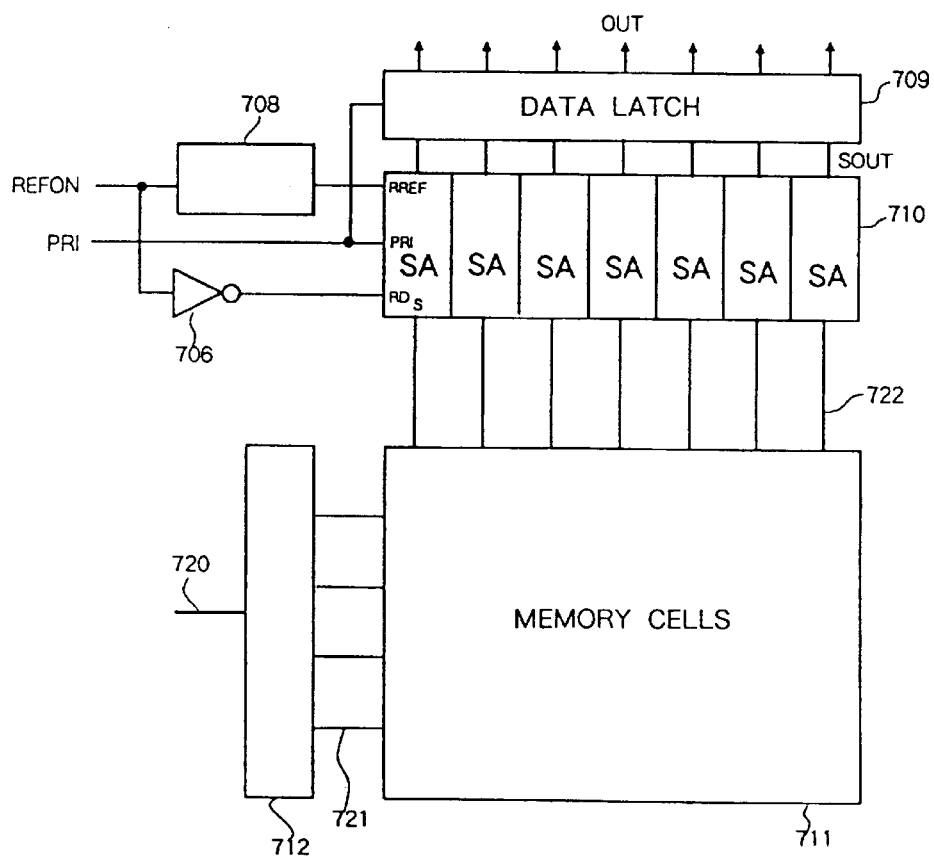
FIG. 2 is a block diagram of a memory block in the conventional semiconductor memory circuit shown in FIG. 1.
Figure 3:
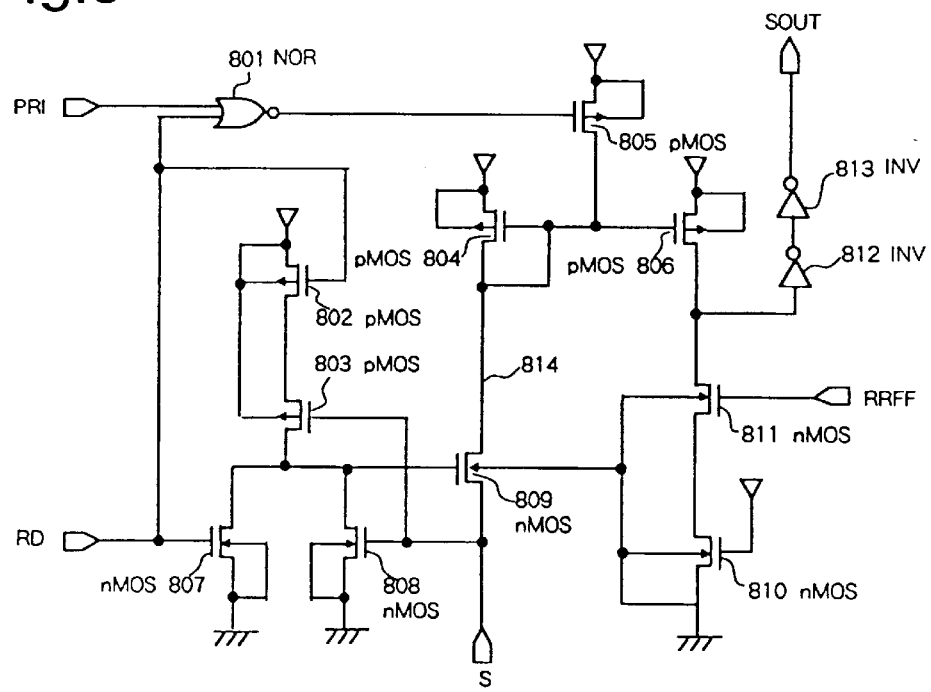
FIG. 3 is a circuit diagram of a sense amplifier in the memory block shown in FIG. 2.

Each of the sense amplifiers 210 in the memory block shown in FIG. 9 is identical in structure to the conventional sense amplifier shown in FIG. 3, and will not be described in detail below.

Figure 4:
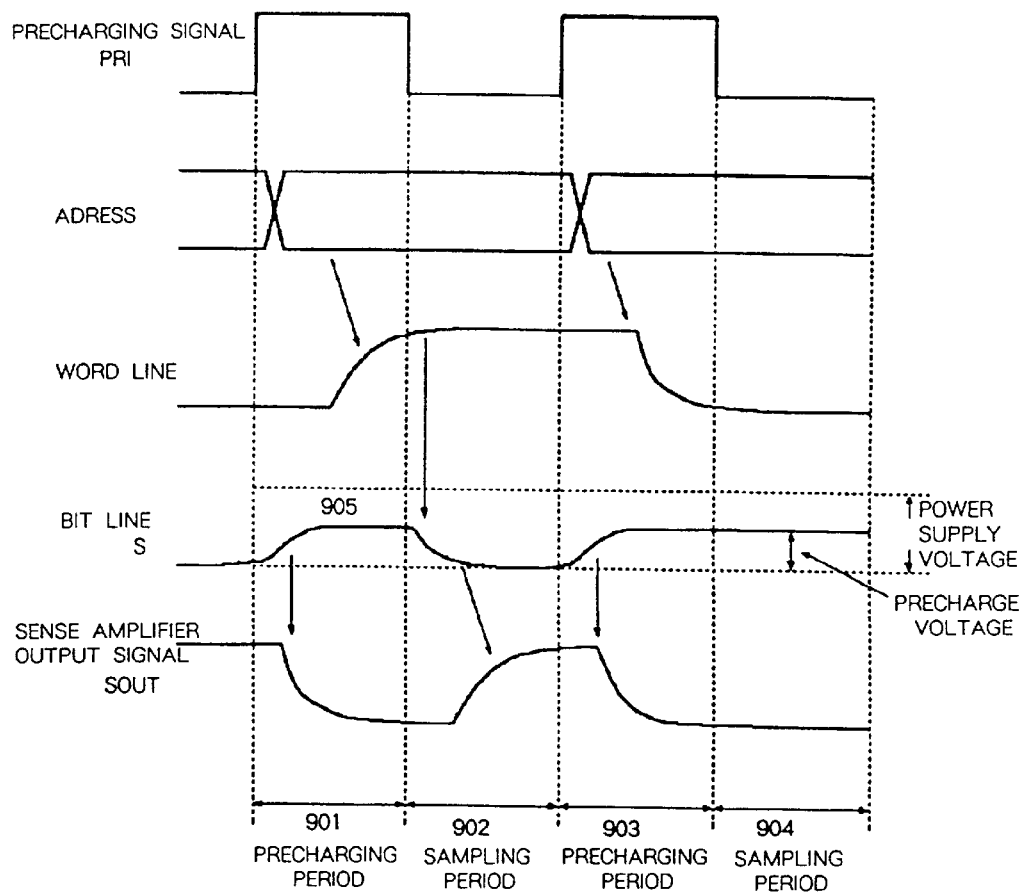
FIG. 4 is a timing chart of an operation sequence of the sense amplifier shown in FIG. 3.
Figure 5:
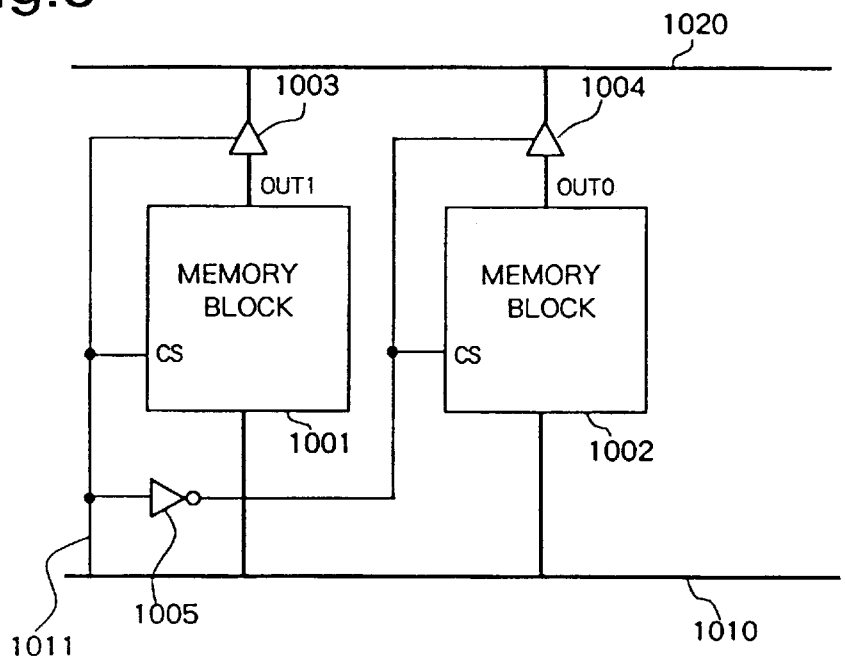
FIG. 5 is a block diagram of a conventional semiconductor memory circuit whose sense amplifiers are de-energized by a most significant bit of address.
Figure 6:
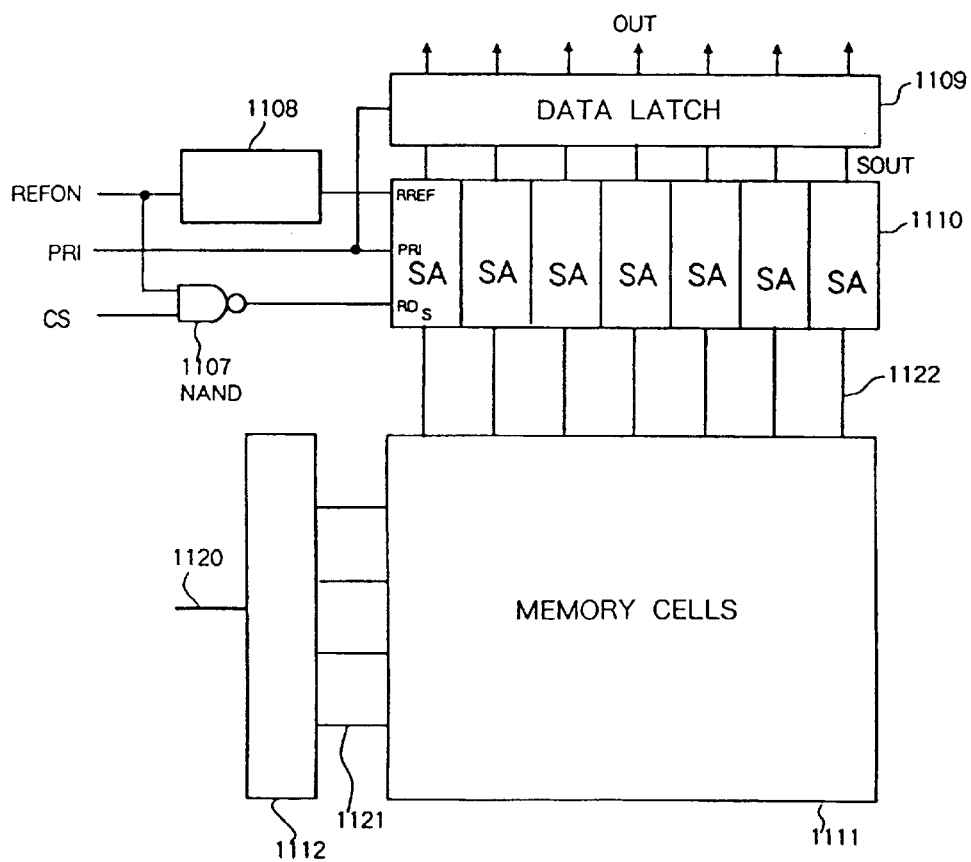
FIG. 6 is a block diagram of a memory block in the conventional semiconductor memory circuit shown in FIG. 5.
Figure 10:
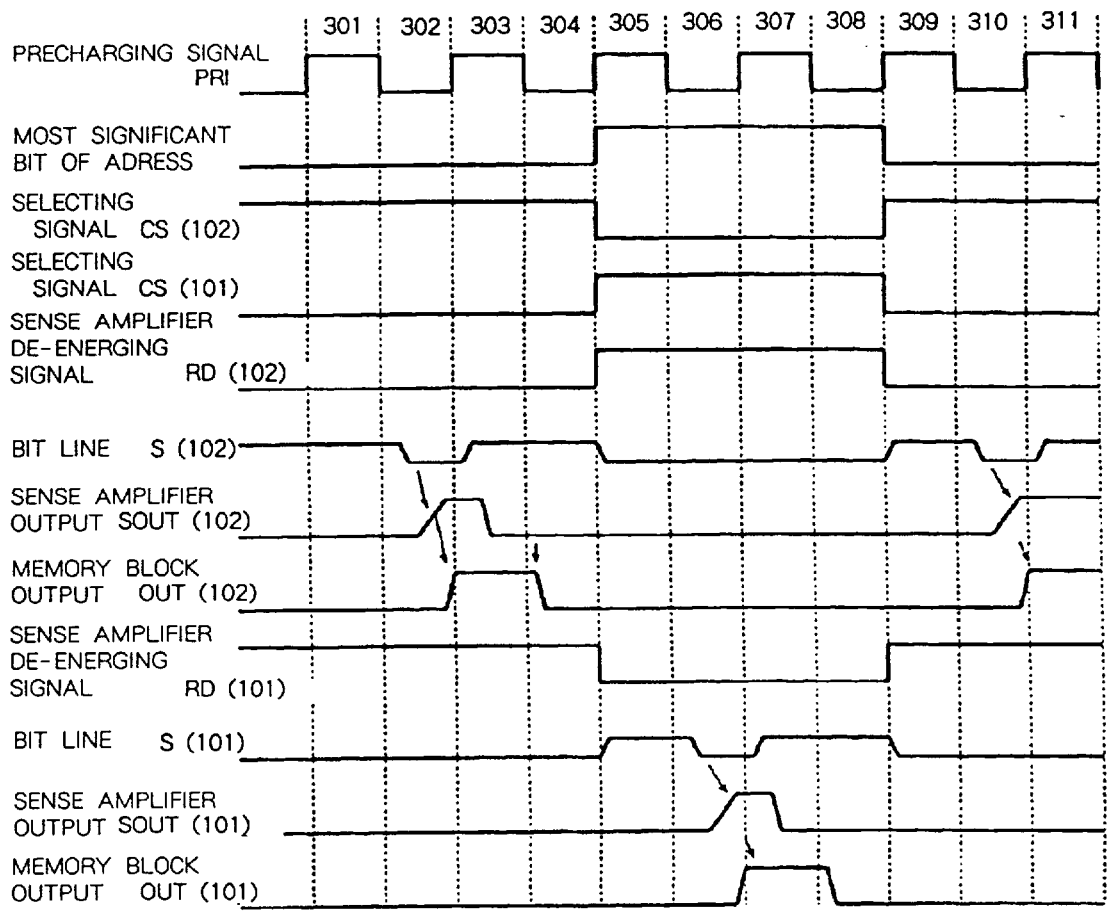
FIG. 10 is a timing chart of an operation sequence for de-energizing sense amplifiers with a most significant bit of address in the semiconductor memory circuit according to the first embodiment shown in FIG. 8.

Operation of the semiconductor memory circuit according to the first embodiment will be described below with reference to FIGS. 8 and 9 and FIG. 10 which shows a timing chart of an operation sequence for de-energizing the sense amplifiers with a most significant bit of address. Since the sense amplifier 210 shown in FIG. 9 is identical in structure to the conventional sense amplifier shown in FIG. 3, and hence an operation sequence of the sense amplifier 210 is identical to the operation sequence shown in FIG. 4, FIGS. 3 and 4 will also be referred to in the following description.

Since the switching of the reference voltage generator 208 is time-consuming, the reference voltage ON signal REFON is turned on at all times during operation of the semiconductor memory circuit.

Periods 301–304 in which the most significant bit of address 111 is "0" in FIG. 10 will first be described below. The period 301 is a precharged period, and the memory block selecting signal CS for the memory block 102 is "1", selecting the memory block 102. Accordingly the NAND gate 207 produced an output "0". Since the sense amplifier de-energizing signal RD is "0", all the nMOS amplifiers 200 through 206 are turned off. At this time, the sense amplifiers 210 are precharged, and the bit lines 222 are precharged to a predetermined voltage lower than the power supply voltage.

On the other hand, the memory block selecting signal CS for the memory block 101 is "0", not selecting the memory block 101. Therefore, the NAND gate 207 produces an output "1", and the sense amplifier de-energizing signal RD becomes "1", turning on all the nMOS transistors 200 through 206. All the bit lines 222 are discharged and fixed to a low level. Since the sense amplifier de-energizing signal RD is "1", the sense amplifiers 210 are de-energized.

In the period 302, since the memory block selecting signal CS for the memory block 102 is "1", the sense amplifiers 210 are in a sampling state, and the bit lines 222 are discharged. The sense amplifiers produce output signals SOUT "1", and the memory block produces an output OUT "1" immediately before the end of the period 302. The memory block selecting signal CS for the memory block 101 is "0", and the sense amplifiers 210 thereof keep de-energized in the same manner as in the period 301.

In the period 303, the sense amplifiers 210 are precharged as in the period 301. In the period 304, the sense amplifiers 210 operate in substantially the same manner as in the period 302. However, since the bit lines 222 remain unchanged, the memory block produces an output OUT "0".

In periods 305–308 in which the most significant bit of address 111 is "1", the sense amplifiers 210 operate in the same manner as in the periods 301–304 except the memory block 101 and the memory block 102 are switched around.

Figure 7:
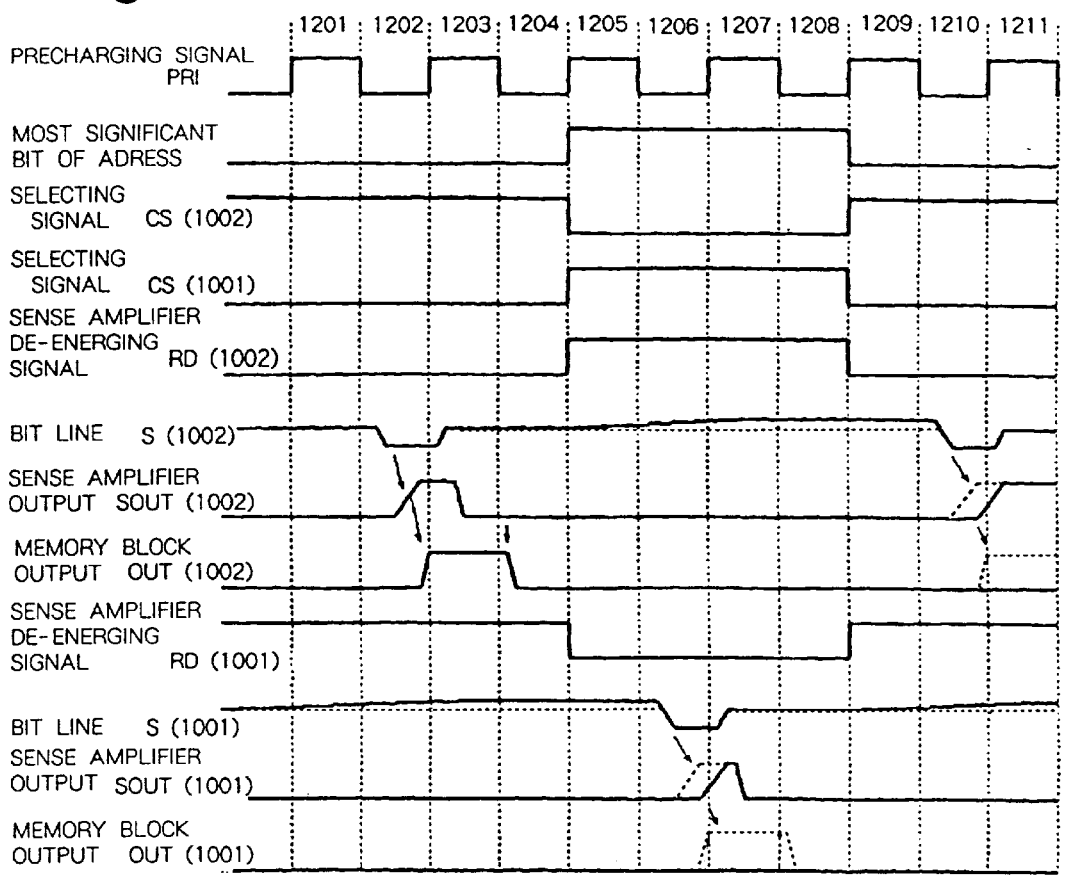
FIG. 7 is a timing chart of an operation sequence for de-energizing sense amplifiers in the conventional semiconductor memory circuit shown in FIG. 5.

Differences between the semiconductor memory circuit according to the present invention and the conventional semiconductor memory circuit will be described below based on a comparison between FIGS. 7 and 10. In the conventional semiconductor memory circuit, even though the bit lines are disconnected from the sense amplifiers, the bit lines may possibly be charged up due to other signals coupled thereto or by extraneous noise. Therefore, the bit lines are charged up to a potential higher than the preset potential, and it may occasionally take more time to discharge the bit lines in the sampling period than it would if they were not charged. Thus, the sense amplifier output signal SOUT changes with a delay, allowing erroneous data "0" to be latched by the data latch.

According to the first embodiment of the present invention, however, since the bit lines disconnected from the sense amplifiers are discharged by the nMOS transistors 200 through 206 that are operated by the memory block selecting signal CS, the bit lines are kept at a low level. Since the sense amplifiers in the memory block that have not been selected are de-energized, much power consumption is reduced. Because the bit lines are fixed to the low level while the sense amplifiers are de-energized, no erroneous operation takes place when the sense amplifiers start operating again.

A semiconductor memory circuit according to a second embodiment of the present invention will be described below with reference to FIG. 11. Each of memory blocks in the semiconductor memory circuit according to the second embodiment is of basically the same structure as the memory block according to the first embodiment shown in FIG. 9. According to the second embodiment, however, a bit line S422 is divided by a Y selector 413. FIG. 12 is a circuit diagram of the Y selector 413 shown in FIG. 11. The semiconductor memory circuit according to the second embodiment as a whole is the same as the semiconductor memory circuit shown in FIG. 8.

Figure 11:
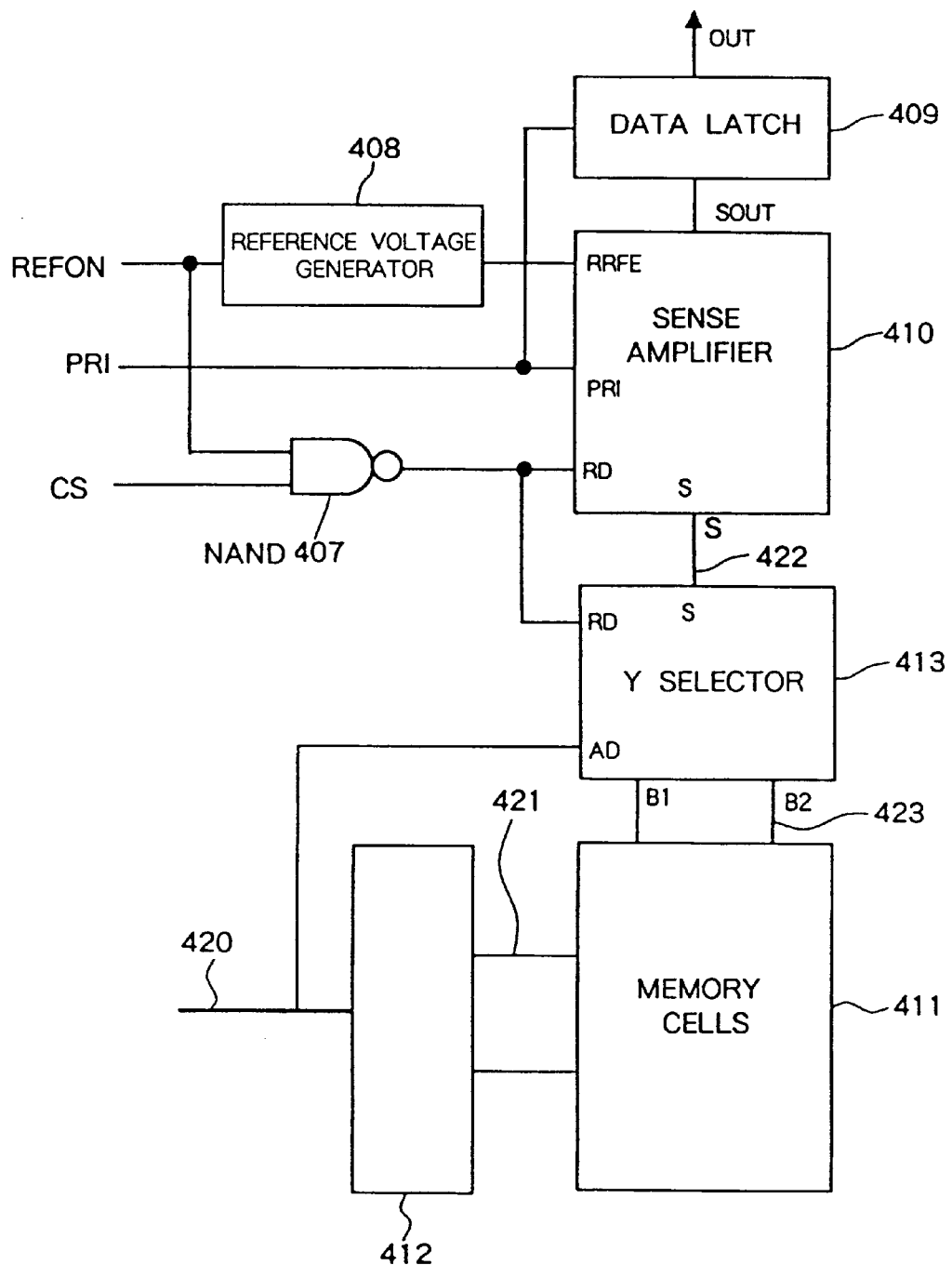
FIG. 11 is a block diagram of a memory block in a semiconductor memory circuit according to a second embodiment of the present invention.
Figure 12:
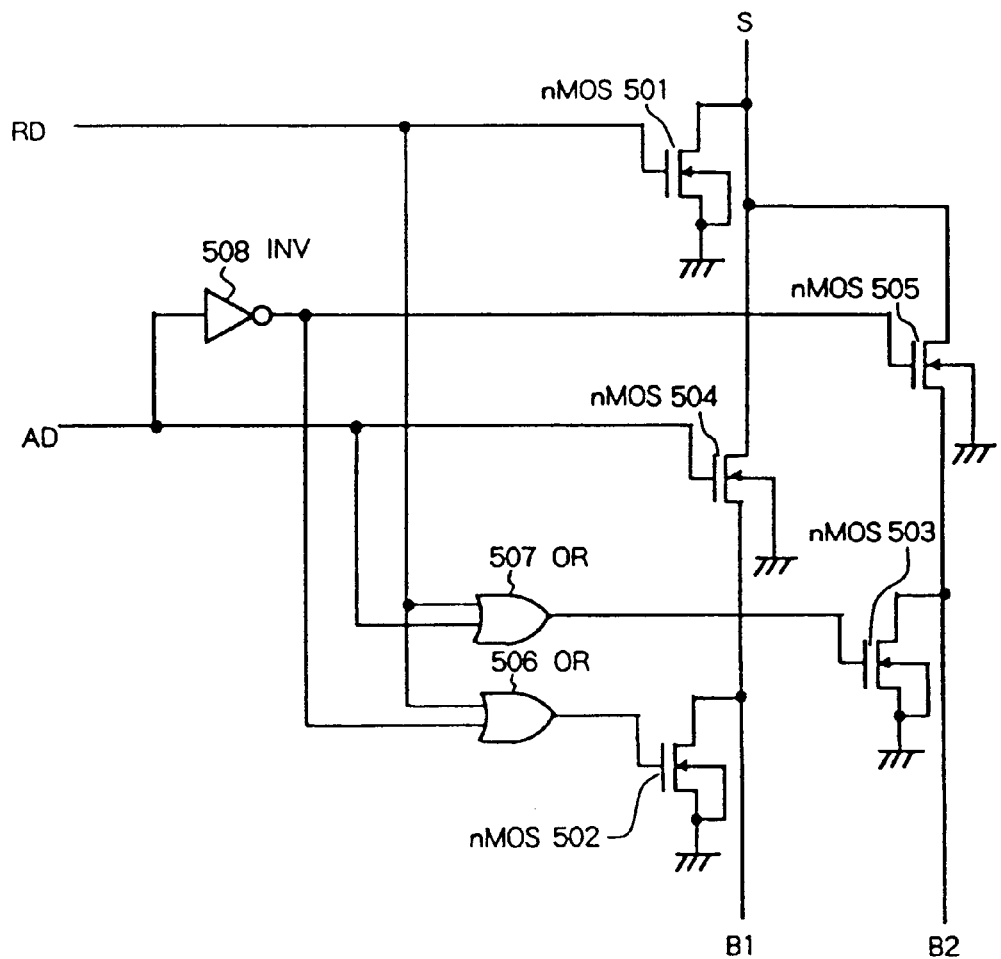
FIG. 12 is a circuit diagram of a Y selector in the semiconductor memory circuit shown in FIG. 11.

As shown in FIG. 11, the memory block in the semiconductor memory circuit according to the second embodiment comprises an X decoder 412 for decoding an address 420 to select a word line 421, a plurality of memory cells 411 for storing data and making corresponding bit lines 423 (B1, B2) active in response to the selection of the word line 421, a Y selector 413 for selecting a bit line 423 which connects to a bit line 422 (S) connected to a sense amplifier 410 from the active bit lines 423 (B1, B2) which are connected to the memory cells 411, a sense amplifier 410 for amplifying a signal change in the bit line 422 (S), a data latch 409 for latching a sense amplifier output during a period in which a precharging signal PRI is PRI=0, a reference voltage generator 408, and a NAND gate 407.

As shown in FIG. 12, the Y selector 413 comprises nMOS transistors 501 through 503 for discharging the respective bit lines B1, B2 and S, nMOS transistors 504, 505 and an inverter 508 for selectively connecting the bit lines B1, B2 to the bit line S, and OR gates 506, 507 for generating signals to discharge the bit lines B1, B2.

In FIG. 12, when the sense amplifier de-energizing signal RD is RD=0 and an address signal AD is AD=1, the nMOS transistor 504 is turned on, connecting the bit line B1 to the bit line S. Since the OR gate 507 produces an output "1", the nMOS transistor 503 is turned on, discharging the bit line B2.

When the sense amplifier de-energizing signal RD is RD=0 and the address signal AD is AD=0, the inverter 508 produces an output "1". The nMOS transistor 505 is turned on, connecting the bit line B2 to the bit line S. Since the OR gate 506 produces an output "1", the nMOS transistor 502 is turned on, discharging the bit line B1.

When the sense amplifier de-energizing signal RD is RD=1, the OR gates 506, 507 produce respective outputs "1", the bit lines S, B1, B2 are discharged.

In the memory block with the Y selector, the bit line disconnected by the Y selector may possibly be charged up due to other signals coupled thereto and extraneous noise. Since the circuit for discharging the bit line that is not selected is added according to the second embodiment, it is possible to produce a preset precharging voltage at all times, allowing the semiconductor memory circuit to operate at high speed.

In the above embodiments, for the sake of brevity, the semiconductor memory circuit has been described with respect to such a memory size that two memory blocks are used and selected one at a time with only a most significant bit of address. However, the present invention is also applicable to any memory size or more than two memory blocks and the same advantages as described above can be achieved insofar as the memory blocks can alternatively be selected by decoding an address.

In the second embodiment, two bit lines are connected from the memory cells to the Y selector. However, even if more than two bit lines are connected, the same advantages as described above can be achieved insofar as those bit lines can alternatively be selected by decoding an address.

As described above, the semiconductor memory circuit according to the present invention is arranged to discharge the bit lines of a memory block which is not selected, so that the sense amplifiers in the memory block can selectively be energized and de-energized by an address without impairing high-speed operation. In this manner, a current consumed by the sense amplifiers can be reduced.

Since the bit lines are discharged when a memory block is not selected, the bit lines are not unduly charged up by other signals coupled thereto or by extraneous noise when the memory block is not selected. Consequently, when the memory block is selected again and starts operating, the bit lines are precharged to a predetermined voltage. Thus, the semiconductor memory circuit is prevented from being slowed down in operation and hence from erroneous operation, i.e., can operate at high speed.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor memory circuit comprising:
   a plurality of memory blocks; and
   selecting means for alternatively selecting said memory blocks;
   each of said memory blocks comprising:
      a plurality of memory cells for storing data, said memory cells being disposed at intersections of a plurality of word lines and a plurality of bit lines;
      a plurality of sense amplifiers for amplifying potential changes in said bit lines;
      sense amplifier control means for controlling an active state of the sense amplifiers depending on an output of said selecting means; and
      discharging means for discharging the bit lines which are connected to the sense amplifiers which are inactivated by said sense amplifier control means.

2. A semiconductor memory circuit according to claim 1, wherein each of said memory blocks has a data latch for latching outputs of said sense amplifiers during a predetermined period.

3. A semiconductor memory circuit according to claim 1, wherein said sense amplifier control means comprises a logic circuit for outputting a sense amplifier de-energizing signal to said sense amplifiers when one of said memory blocks is not selected, and wherein said discharging means comprises a plurality of MOS transistors connected respectively to said bit lines for grounding the bit lines when said one of the memory blocks is not selected.

4. A semiconductor memory circuit according to claim 3, comprising:
   two said memory blocks each for outputting data in response to an address;
   two tristate buffers for alternatively selecting outputs of said memory blocks in response to a most significant bit of address; and
   an inverter for generating a memory block selecting signal to control one of said tristate buffers;
   each of said memory blocks comprising:
      a decoder for decoding an address;
      said plurality of memory cells for storing data;
      said plurality of bit lines connected to said memory cells;
      said plurality of sense amplifiers for amplifying potential changes in said bit lines;
      a data latch for latching outputs of said sense amplifiers during a period in which a precharging signal is "0";
      a NAND gate for generating the sense amplifier de-energizing signal in response to said memory block selecting signal and a reference voltage ON signal;
      a plurality of nMOS transistors connected respectively to said bit lines, for grounding the bit lines in response to said sense amplifier de-energizing signal; and
      a reference voltage generator for supplying a reference voltage to said sense amplifiers.

5. A semiconductor memory circuit comprising:
   a plurality of memory blocks; and
   selecting means for alternatively selecting said memory blocks;
   each of said memory blocks comprising:
      a plurality of memory cells for storing data, said memory cells being disposed at intersections of a plurality of word lines and a plurality of bit lines;
      a sense amplifier for amplifying a potential change in a bit line connected thereto;
      a selector for selecting and connecting one of said bit lines to said sense amplifier;
      sense amplifier control means for controlling an active state of the sense amplifiers depending on an output of said selecting means; and
      discharging means for discharging the bit lines;
      said discharging means comprising means for discharging said bit line connected to said sense amplifier inactivated by said sense amplifier control means and said bit line connected to said selector, and discharging the bit lines which are not selected which are connected to said selector if said sense amplifier is active.

6. A semiconductor memory circuit according to claim 5, wherein each of said memory blocks has a data latch for latching an output of said sense amplifier during a predetermined period.

7. A semiconductor memory circuit according to claim 5, wherein said sense amplifier control means comprises a logic circuit for outputting a sense amplifier de-energizing signal to said sense amplifier when one of said memory blocks is not selected, and wherein said discharging means comprises a plurality of MOS transistors connected respectively to said bit lines connected to said memory cells and said bit line connected said sense amplifier, for grounding the bit lines if the bit lines are not selected.

8. A semiconductor memory circuit according to claim 7, wherein each of said memory blocks comprises:

an X decoder for decoding an address to select one of said word lines;

said memory cells each for making two of said bit lines active in response to the selection of the word line;

a Y selector for selecting one of said two bit lines connected to the memory cell;

said sense amplifier for amplifying a potential change in the bit line selected by said Y selector;

said data latch for latching the output of said sense amplifier during a period in which a precharging signal is "0";

a reference voltage generator; and a NAND gate for outputting the sense amplifier de-energizing signal to said sense amplifier and said Y selector in response to a selecting signal;

said Y selector comprising:

two nMOS transistors for selectively connecting said two bit lines connected to said memory cell to the bit line connected to said sense amplifier;

an inverter;

three nMOS transistors for discharging three of said bit lines; and two OR gates for generating a signal to selectively discharge said two bit lines connected to said memory cell.

9. A semiconductor memory circuit comprising:

a plurality of memory blocks; and a block selector operative to select one or more of said memory blocks;

wherein each of said memory blocks comprises;

a plurality of memory cells operative to store data, said memory cells being disposed at intersections of a plurality of word lines and a plurality of bit lines;

a plurality of sense amplifiers operative to amplify changes in an electrical potential of said bit lines;

a sense amplifier controller operative to activate or deactivate the sense amplifiers depending on an output of said block selector; and a bit line discharger operative to discharge the bit lines which are connected to the input of the sense amplifiers and which are inactivated by said sense amplifier control means.

10. A semiconductor memory circuit in accordance with claim 9 further comprising a latch circuit operative to latch output signals from said sense amplifiers.

* * * * *

UNITED STATES PATENT AND TRADEMARK OFFICE
CERTIFICATE OF CORRECTION

PATENT NO.: 6,118,714
DATED: September 12, 2000
INVENTOR(S): Takashi IENAGA

It is certified that error(s) appears in the above-identified patent and that said Letters Patent is hereby corrected as shown below:

Column 5, lines 39-40, delete "when one of the memory blocks is not selected, and wherein the" insert --when the memory block having the sense amplifiers is not selected. The--;

lines 42-44, delete "connected to the memory cells and the bit line connected the sense amplifier, for grounding the bit lines if the bit lines are not selected." after "bit lines", insert --for grounding the bit lines when one of the memory blocks is not selected--

Signed and Sealed this

Twenty-second Day of May, 2001

*Attest:*

NICHOLAS P. GODICI

*Attesting Officer*   *Acting Director of the United States Patent and Trademark Office*